US007808342B2

(12) United States Patent
Prikhodko et al.

(10) Patent No.: US 7,808,342 B2
(45) Date of Patent: Oct. 5, 2010

(54) HARMONIC PHASE TUNING FILTER FOR RF SWITCHES

(75) Inventors: Dima Prikhodko, Woburn, MA (US); Gene A. Tkachenko, Belmont, MA (US); Richard A. Carter, Hampton, NH (US); Sergey Nabokin, Pelham, NH (US); Jason Chiesa, Pelham, NH (US); Steven C. Sprinkle, Hampstead, NH (US); Yu Zhu, Wellesley, MA (US); Beverly A. Peluso, Wilmington, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 107 days.

(21) Appl. No.: 11/827,618

(22) Filed: Jul. 12, 2007

(65) Prior Publication Data

US 2008/0079514 A1 Apr. 3, 2008

Related U.S. Application Data

(60) Provisional application No. 60/848,680, filed on Oct. 2, 2006.

(51) Int. Cl.
*H01P 5/08* (2006.01)
*H01P 1/15* (2006.01)
*H03H 7/01* (2006.01)

(52) U.S. Cl. .................... 333/103; 333/32; 333/175
(58) Field of Classification Search ......... 333/167–185, 333/32, 101, 103–105
See application file for complete search history.

(56) References Cited

U.S. PATENT DOCUMENTS 5,095,285 A * 3/1992 Khatibzadeh ............... 330/306

| 5,528,196 | A | | 6/1996 | Baskin et al. |
| 5,644,268 | A | | 7/1997 | Hang |
| 5,969,582 | A | * | 10/1999 | Boesch et al. ............... 333/129 |
| 6,163,713 | A | | 12/2000 | Suzuki et al. |
| 6,560,443 | B1 | | 5/2003 | Vaisanen et al. |
| 6,642,578 | B1 | | 11/2003 | Arnold et al. |
| 6,803,680 | B2 | | 10/2004 | Brindle et al. |
| 6,804,502 | B2 | | 10/2004 | Burgener et al. |

(Continued)

FOREIGN PATENT DOCUMENTS

JP 1997-083259 3/1997

(Continued)

OTHER PUBLICATIONS

Yasuda, et al., *An Ultra-Low Distortion 3P2T Antenna Switch MMIC for Dual-band W-CDMA Applications*, IEEE, 455-458 (2005).

(Continued)

*Primary Examiner*—Benny Lee
*Assistant Examiner*—Gerald Stevens
(74) *Attorney, Agent, or Firm*—Lando & Anastasi, LLP (57) ABSTRACT

According to one exemplary embodiment, a switching module includes a first harmonic phase tuning filter coupled to a first input of an RF switch. The first harmonic phase tuning filter is configured to provide an output impedance that substantially matches an input impedance of the RF switch at approximately a fundamental frequency and to provide a low impedance at approximately a harmonic frequency generated by the RF switch. The first harmonic phase tuning filter includes an LC circuit coupled between an output terminal of the first harmonic phase tuning filter and a ground and tuned to provide the low impedance at approximately the harmonic frequency generated by the RF switch. The RF switching module further includes a second harmonic phase tuning filter coupled to a second input of the RF switch. The first and second harmonic phase tuning filters can be fabricated on a single semiconductor die.

9 Claims, 4 Drawing Sheets

U.S. PATENT DOCUMENTS

| | | | |
|---|---|---|---|
| 6,829,471 | B2 | 12/2004 | White et al. |
| 6,835,968 | B2 | 12/2004 | Kitazawa et al. |
| 6,876,258 | B2 | 4/2005 | Ohta et al. |
| 6,917,259 | B2 | 7/2005 | Hirabayashi |
| 7,076,216 | B2 | 7/2006 | Hiyashi |
| 7,088,971 | B2 | 8/2006 | Burgener et al. |
| 7,098,755 | B2 | 8/2006 | Zhao et al. |
| 7,098,759 | B2 | 8/2006 | Chang |
| 7,180,758 | B2 | 2/2007 | Lincoln et al. |
| 7,199,635 | B2 | 4/2007 | Nakatsuka et al. |
| 7,202,736 | B1 | 4/2007 | Dow et al. |
| 7,206,551 | B2 * | 4/2007 | Itakura et al. ............ 455/73 |
| 7,239,853 | B2 | 7/2007 | Kearns |
| 7,259,643 | B2 | 8/2007 | Son et al. |
| 7,391,283 | B2 | 6/2008 | Kearns |
| 7,417,515 | B2 | 8/2008 | Chominski |
| 7,418,251 | B2 * | 8/2008 | Liu ............ 455/333 |
| 7,459,988 | B1 | 12/2008 | Iverson |
| 7,479,844 | B2 | 1/2009 | Kormanyos |
| 7,492,209 | B2 | 2/2009 | Prikhodko et al. |
| 2004/0127182 | A1 | 7/2004 | Hayashi |
| 2004/0132487 | A1 | 7/2004 | Kearns |
| 2005/0012400 | A1 | 1/2005 | Gresham |
| 2005/0282503 | A1 | 12/2005 | Onno et al. |
| 2005/0287976 | A1 | 12/2005 | Burgener et al. |
| 2006/0051038 | A1 * | 3/2006 | Imai et al. ............ 385/122 |
| 2006/0158911 | A1 | 7/2006 | Lincoln et al. |
| 2008/0079513 | A1 | 4/2008 | Prikhodko |
| 2008/0180189 | A1 | 7/2008 | Miya |
| 2009/0015347 | A1 | 1/2009 | Prikhodko |
| 2009/0015508 | A1 | 1/2009 | Prikhodko |

FOREIGN PATENT DOCUMENTS

| | | | |
|---|---|---|---|
| WO | | 2008042099 A3 | 4/2008 |

OTHER PUBLICATIONS

Holm, et al., *Charge Effects and Transient Simulation of p-HEMT Meander Gate Switches*, EuMA, 367-370 (Sep. 2006).

Masuda, et al., *High Power Heterojunction GaAs Switch IC with P-1dB of more than 38dBm for GSM Application*, IEEE, 229-232 (1998).

Shifrin, et al., *Monlithic FET Structures for High-Power Control Component Applications*, IEEE Transactions on Microwave Theory and Techniques, vol. 37, No. 12, 2134-2141 (Dec. 1989).

Gotch, et al., *State-of-the-Art Low Loss, High Isolation SP6T Switch for Handset Applications*, European Conference on Wireless Technology, 17-20 (2004).

Kohama, et al., *High Power DPDT Antenna Switch MMIC for Digital Cellular Systems*, IEEE Journal of Solid-State Circuits, vol. 31, No. 10, 1406-1411 (Oct. 1996).

*Digital cellular telecommunications system (Phase 2+); Radio transmission and reception (3GPP TS 05.05 version 8.6.0 Release 1999)*, ETSI TS 100 910 V8.6.0 (Sep. 2000), 1-95.

* cited by examiner

HARMONIC PHASE TUNING FILTER FOR RF SWITCHES

The present application claims the benefit of and priority to a provisional patent application entitled "Integrated Harmonic Matching for RF Switches," Ser. No. 60/848,680 filed on Oct. 2, 2006. The disclosure in that provisional application is hereby incorporated fully by reference into the present application.

BACKGROUND OF THE INVENTION

1. Field of the Invention

The present invention is generally in the field of electrical circuits. More specifically, the invention is in the field of communications circuits.

2. Related Art

Multi-throw RF switches having multiple inputs and a shared output can be used in mobile communication devices, such as cellular handsets, to provide operation at more than one frequency. For example, a multi-throw RF switch can be used in a cellular handset operating in a system using a global system for mobile communications (GSM) communications standard to enable the cellular handset to operate either at a low band frequency of 900.0 MHz or a high band frequency of 1800.0 MHz by selectively coupling a corresponding input to the shared output. For multi-throw RF switches, such as multi-throw RF switches used in mobile communication devices using the GSM communications standard, there is a continuing need to reduce harmonics, such as third harmonics, generated by the switch and generated by power amplifiers that are coupled to the inputs of the switch.

A conventional multi-throw RF switch can include two or more switching arms, where each switching arm includes a number of field effect transistors (FETs) coupled in "series," and where each switching arm is coupled to a separate input, which can be coupled to a power amplifier, and a shared output, which can be coupled to an antenna. To reduce harmonics generated by the power amplifier, a conventional filter, which is a discrete filtering device, can be coupled between the input of the RF switch and the power amplifier. Although the conventional filter can reduce the level of harmonics generated by the power amplifier, it (i.e. the conventional filter) may not provide a sufficient reduction in harmonics, such as third harmonics, generated by the multi-throw RF switch.

SUMMARY OF THE INVENTION

Harmonic phase tuning filter for RF switches, substantially as shown in and/or described in connection with at least one of the figures, as set forth more completely in the claims.

DETAILED DESCRIPTION OF THE INVENTION

The present invention is directed to a harmonic phase tuning filter for RF switches. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
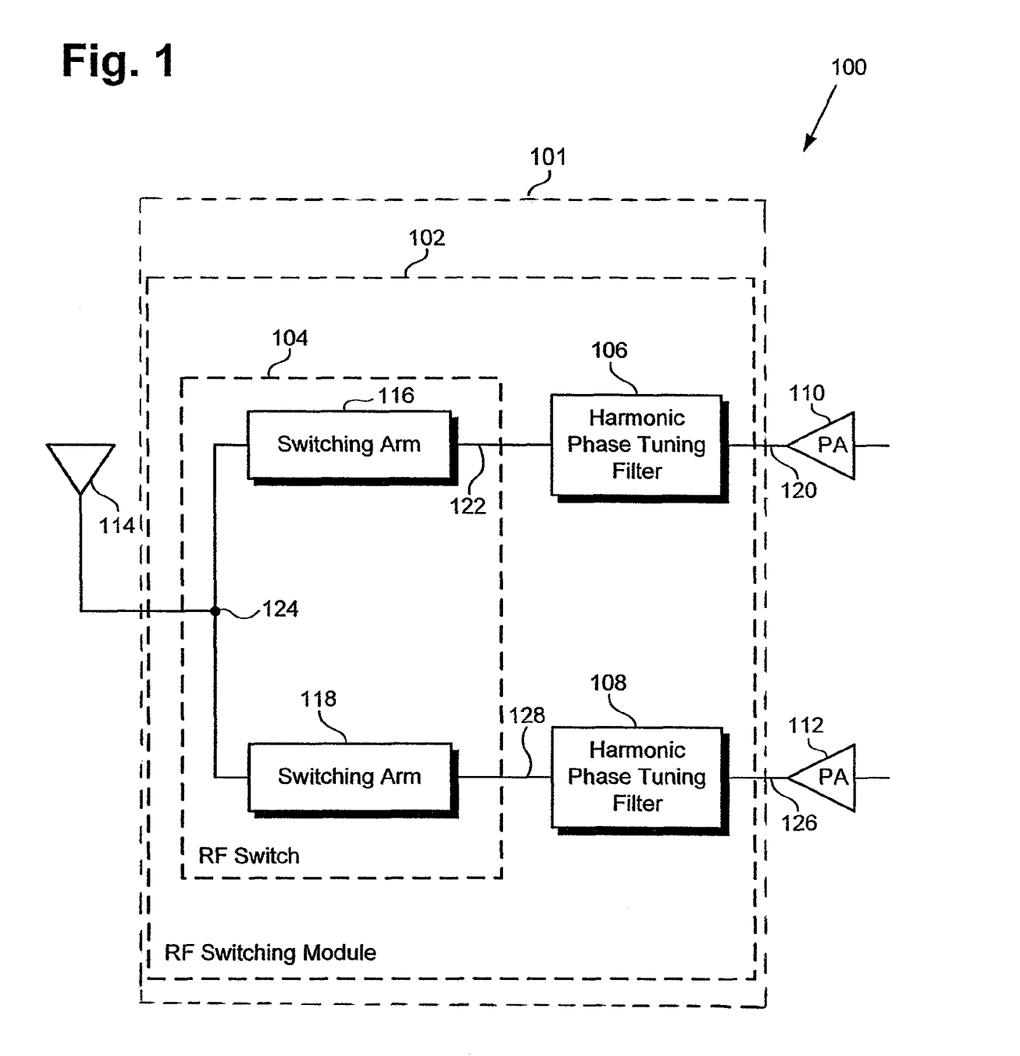
FIG. 1 illustrates a block diagram of an exemplary RF transmit system in accordance with one embodiment of the present invention.

FIG. 1 shows a block diagram of RF transmit system 100 in accordance with one embodiment of the present invention. RF transmit system 100 includes RF switching module 102 (also referred to simply as a "switching module" in the present application), which includes RF switch 104 and harmonic phase tuning filters 106 and 108, power amplifiers 110 and 112, and antenna 114. RF switch 104 includes switching arms 116 and 118. RF transmit system 100 can be an RF transmit sub-block of a communications system, such as a communications system using GSM or wideband code-division multiple access (W-CDMA) communications standards, which can include an RF receive sub-block (not shown in FIG. 1). In the present embodiment, RF switching module 102 can be fabricated on a single semiconductor die 101 so as to integrate RF switch 104 and harmonic phase tuning filters 106 and 108.

As shown in FIG. 1, the output of power amplifier (PA) 110 is coupled to the input of harmonic phase tuning filter 106 via line 120 and the output of harmonic phase tuning filter 106 is coupled to the input of switching arm 116 at an input of RF switch 104 by line 122. Power amplifier 110 can output an RF signal, such as an 1800.0 MHz high band GSM signal, for transmission over antenna 114 when switching arm 116 of RF switch 102 is enabled. RF switch 104 can be a multi-throw RF switch, where each switching arm, i.e., switching arm 116 and switching arm 118, is coupled between a separate input and a shared output of the switch. In an embodiment, harmonic phase tuning filter 106 can be configured to provide a selected impedance at a harmonic frequency, such as a second or third harmonic frequency, generated by RF switch 104 by appropriately tuning the phase of the harmonic so as to improve the harmonic performance of the switch. In an embodiment, harmonic phase tuning filter 106 can be tuned to provide, for example, a low impedance at a third harmonic frequency generated by RF switch 104 (in the present application, a "harmonic frequency" includes the precise harmonic frequency and also frequencies that are sufficiently close to the precise harmonic frequency, collectively referred to herein as "approximately a harmonic frequency").

In the present application, a harmonic impedance that is sufficiently high so as to cause substantially an open circuit at a harmonic frequency, such as a second or third harmonic frequency, is defined as a "phase open" and a harmonic impedance that is sufficiently low so as to cause substantially a short circuit at the harmonic frequency is defined as a "phase short." In one embodiment, harmonic phase tuning filter 106 can be tuned to provide a selected impedance at a harmonic frequency, such as a third harmonic frequency, generated by the RF switch, where the selected impedance is achieved by appropriately rotating the phase of harmonic frequency between a phase short and a phase open.

Harmonic phase tuning filter 106 can also be configured to reduce the harmonic level, such as the third harmonic level, generated by power amplifier 110. Harmonic phase tuning filter 106 can be further configured to provide an output impedance, such as a 50.0 ohm output impedance, that substantially matches the input impedance of switching arm 116 of RF switch 102 at a fundamental frequency, which is inputted into the switching arm from power amplifier 110 (in the present application, a "fundamental frequency" includes the precise fundamental frequency and also frequencies that are sufficiently close to the precise fundamental frequency, collectively referred to herein as "approximately a fundamental frequency").

Thus, while being tuned to provide a selected impedance at a harmonic frequency generated by RF switch 102, harmonic phase tuning filter 106 is also tuned to provide an output impedance that substantially matches the input impedance of the RF switch at the fundamental frequency.

Also shown in FIG. 1, the output of switching arm 116 is coupled to the output of switching arm 118 at node 124, which is coupled to antenna 114 via the shared output of RF switch 102. Further shown in FIG. 1, the output of power amplifier 112 is coupled to the input of harmonic phase tuning filter 108 via line 126 and the output of harmonic phase tuning filter 108 is coupled to the input of switching arm 118 at an input of RF switch 104 by line 128. Power amplifier 112 can output an RF signal, such as an 900.0 MHz low band GSM signal, for transmission over antenna 114 when switching arm 118 of RF switch 102 is enabled. The RF signal outputted by power amplifier 112 can have a different frequency than the frequency of the RF signal outputted by power amplifier 110. Harmonic phase tuning filter 108 can be configured in a substantially similar manner to harmonic phase tuning filter 106 discussed above. However, since the fundamental frequency of the RF signal inputted into harmonic phase tuning filter 108 is different than the fundamental frequency inputted into harmonic phase tuning filter 106, harmonic phase tuning filter 108 is tuned to provide a desired impedance at a different harmonic frequency than harmonic phase tuning filter 106.

By tuning the phase of a harmonic, such as a second or third harmonic, to match a particular RF switch, such as RF switch 104, which is integrated with harmonic phase tuning filters, such as harmonic phase tuning filters 106 and 108, the invention advantageous improves the harmonic performance of the RF switch.

Figure 2:
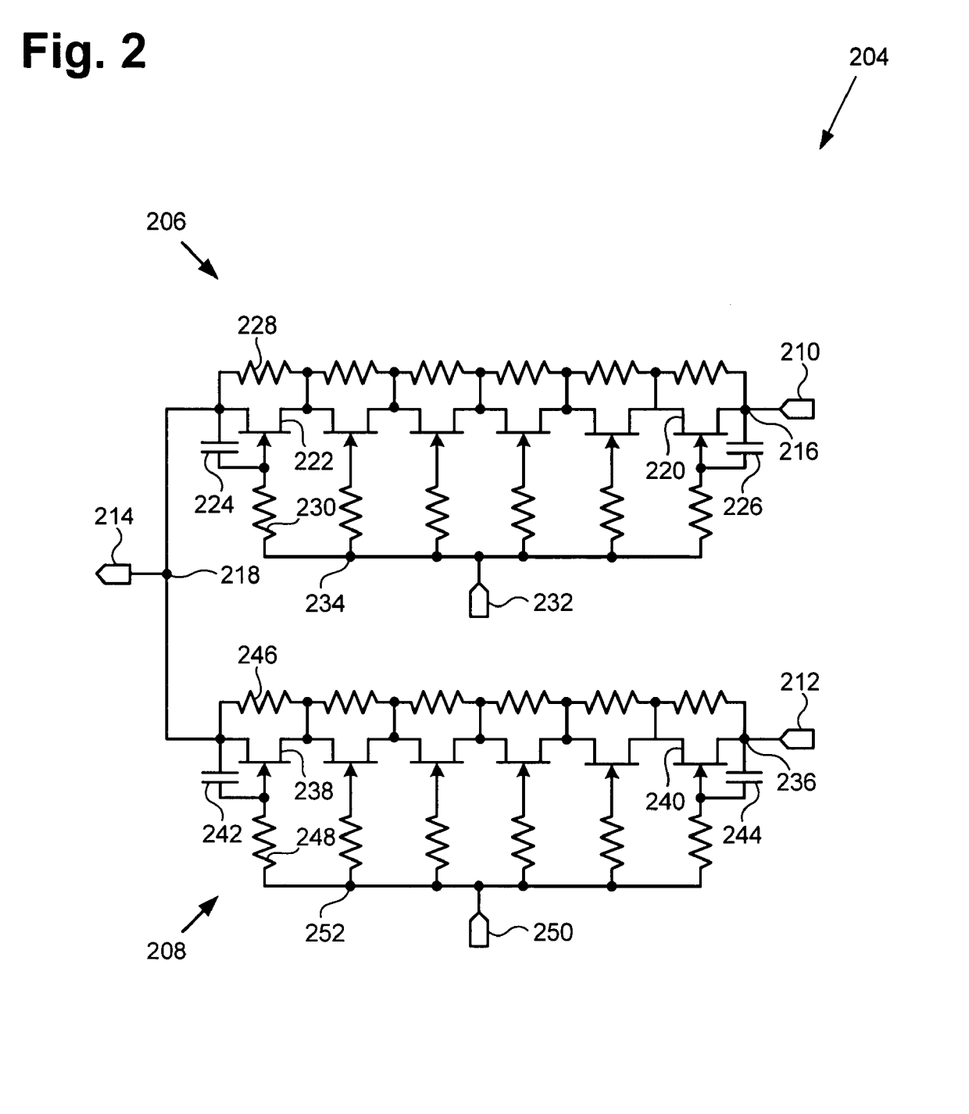
FIG. 2 illustrates a diagram of an exemplary RF switch in accordance with one embodiment of the present invention.

FIG. 2 shows a schematic diagram of RF switch 204 in accordance with one embodiment of the present invention. RF switch 204 corresponds to RF switch 104 in RF switching module 102 in FIG. 1. In particular, switching arms 206 and 208 in RF switch 204 correspond, respectively, to switching arms 116 and 118 in RF switch 104. RF switch 204 is an exemplary multi-throw RF switch that can be integrated with the invention's harmonic phase tuning filters, such as harmonic phase tuning filters 106 and 108 in FIG. 1, to improve the RF switch's harmonic performance. RF switch 204 can be integrated with the invention's harmonic phase tuning filters and utilized in wireless communications devices, such as cellular telephones, that utilize GSM or W-CDMA communications standards. In one embodiment, RF switch 204 can include more than two switching arms.

As shown in FIG. 2, RF switch 204 has signal inputs 210 and 212, which can be RF signal inputs, and signal output 270, which can be an RF signal output and which is also referred to as a "shared output" in the present application. Signal inputs 210 and 212 can each be coupled to an output of the invention's harmonic phase tuning filter, such as harmonic phase tuning filters 106 and 108 in FIG. 1. Signal output 270 can be coupled to an antenna, such as antenna 114 in FIG. 1.

Also shown in FIG. 2, the input of switching arm 206 is coupled to signal input 210 at node 216 and the output of switching arm 206 is coupled to signal output 214 at node 218. Switching arm 206 can include six FETs, such as FETs 220 and 222, which are coupled in series between nodes 216 and 218. Each of the FETs in switching arm 206 can be, for example, an NFET. Further shown in FIG. 2, capacitor 224 is coupled between the drain and gate of FET 222 and capacitor 226 is coupled between the source and gate of FET 220. Also shown in FIG. 2, a resistor, such as resistor 228, is coupled between the drain and source of each FET in switching arm 206 and a resistor, such as resistor 230, is coupled between the gate of each FET in switching arm 206 and control voltage input 232 and node 234.

Further shown in FIG. 2, the input of switching arm 208 is coupled to signal input 212 at node 236 and the output of switching arm 208 is coupled to signal output 214 at node 218. Switching arm 208 can include six FETs, such as FETs 238 and 240, which are coupled in series between nodes 236 and 218. Each of the FETs in switching arm 206 can be, for example, an NFET. Further shown in FIG. 2, capacitor 242 is coupled between the drain and gate of FET 238 and capacitor 244 is coupled between the source and gate of FET 240. Also shown in FIG. 2, a resistor, such as resistor 246, is coupled between the drain and source of each FET in switching arm 208 and a resistor, such as resistor 248, is coupled between the gate of each FET in switching arm 208 and control voltage input 250 and node 252.

In RF switch 204, control voltage inputs 232 and 250 can receive a high control voltage (VH), which can be between approximately 2.4 volts and approximately 6.1 volts, for example, to enable, i.e., turn on, respective switching arms 206 and 208. Control voltage inputs 232 and 250 can also receive a low control voltage (VL), which can be approximately 0.0 volts, for example, to disable, i.e., turn off, respective switching arms 206 and 208.

The operation of RF switch 204 will now be discussed. Switching arm 206 can be enabled by applying VH (i.e. a high control voltage) to control voltage input 232 to turn on the FETs in switching arm 206, and switching arm 208 can be disabled by applying VL (i.e. a low control voltage) to control voltage input 250 to turn off the FETs in switching arm 208, and vice versa. Thus, in RF switch 204, either switching arm 206 can be enabled and switching arm 208 can be disabled, or switching arm 206 can be disabled and switching arm 208 can be enabled. In the present application, the switching arm that is enabled is also referred to as the "ON arm" and the switching arm that is disabled is also referred to as the "OFF arm." When switching arm 206 is enabled and switching arm 208 is disabled, for example, signal input 210 is coupled to signal output 214 such that an RF signal, e.g., an 1800.0 MHz high band GSM signal, is allowed to pass through the FETs in the ON arm to signal output 214. Also, signal input 212 is decoupled from signal output 214 such that another RF signal, e.g., a 900.0 MHz low band GSM signal, at signal input 212 is prevented from passing through the FETs in the OFF arm to signal output 270.

When switching arm 206 is enabled and switching arm 208 is disabled, an RF signal at signal output 214 provides a peak RF voltage (Vrf) at node 218, which is equally divided between gate/drain and gate/source junctions of each FET in the OFF arm, i.e., switching arm 208, and vice versa. A high Vrf at node 218 can cause the voltage at the gate/drain and gate/source junctions of each FET in the OFF arm to approach the pinch off region of the FET, which can cause an undesirable increase in harmonic levels (i.e. amplitudes), such as the third harmonic level, by causing one or more of the FETs in the OFF arm to turn on.

There are two primary mechanisms to limit the amplitude of the harmonics, such as the third harmonic, of RF switch 204: voltage limitation and current limitation. The absolute value of the third harmonic amplitude for high values of VH is typically limited by the current capability of the switch, i.e., the size of the FETs in the switching arms, and for low values of VH the absolute value of the third harmonic amplitude is typically limited by how close the swing of Vrf comes to the pinch off region of the FETs in the OFF arm. The number of FETs in each switching arm can affect both the current and voltage limitations.

In the present application, a voltage level of VH below approximately 4.3 volts can be referred to as a "voltage limited region" and a voltage level of VH above approximately 4.3 volts can be referred to as a "current limited region." The second and third harmonic levels increase at a 50.0 ohm impedance termination as VH decreases in the voltage limited region. The voltage and current limited regions each require different impedance terminations at the second and third harmonics to reduce harmonic levels in the RF switch. For example, compared to a third harmonic level at a 50.0 ohm impedance termination, a high impedance termination at the third harmonic frequency causes a reduction in the third harmonic level in the voltage limited region and an increase in the third harmonic level in the current limited region. For example, compared to the third harmonic level at a high impedance termination, a low impedance termination causes an increase in the third harmonic level in the voltage limited region and a reduction in the third harmonic level in the current limited region.

In the present invention, harmonic phase tuning filters, such as harmonic phase tuning filters 106 and 108 in FIG. 1, are integrated with a multi-throw RF switch, such as RF switch 204, and are configured to provide a selected impedance, such as a phase open or phase short, at a harmonic frequency, such as a second or third harmonic frequency, by appropriately tuning the phase of the harmonic so as to improve the harmonic performance of the switch. For example, if an RF switch, such as RF switch 204, is voltage limited, i.e., VH is in the voltage limited region, a harmonic phase tuning filter coupled to each switching arm can be tuned for a phase open at the third harmonic frequency to reduce the third harmonic level in the RF switch. For example, if the RF switch is current limited, i.e., VH is in the current limited region, the harmonic phase tuning filter can be tuned for a phase short at the third harmonic frequency to reduce the third harmonic level in the RF switch.

Generally, the ON arm is more responsible for the current limitation and the OFF arm is more responsible for the voltage limitation. A high impedance that causes substantially an open circuit at the third harmonic, i.e., a phase open, may reduce the third harmonic level in the ON arm and increase the third harmonic level in the OFF arm, while a phase short may increase the third harmonic level in the ON arm and reduce the third harmonic level in the OFF arm. An embodiment of the invention's harmonic phase tuning filter can be tuned between a phase short and an phase open so as to provide an optimum impedance at a harmonic frequency, such as a third harmonic frequency, which advantageously improves or increases harmonic performance in both ON and OFF arms of the RF switch.

Figure 3:
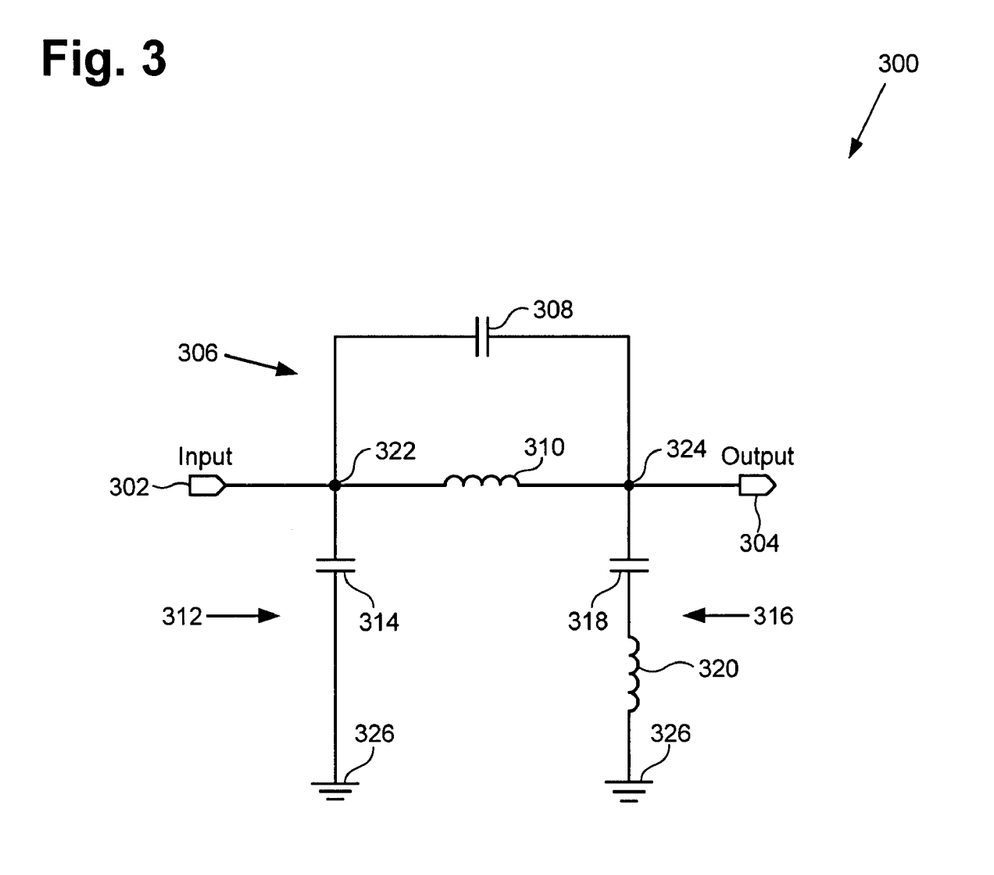
FIG. 3 illustrates a diagram of an exemplary harmonic phase tuning filter in accordance with one embodiment of the present invention.

FIG. 3 shows a schematic diagram of harmonic phase tuning filter 300 in accordance with one embodiment of the present invention. Harmonic phase tuning filter 300 is an exemplary embodiment of the invention's harmonic phase tuning filter, such as harmonic phase tuning filters 106 and 108 in FIG. 1. Harmonic phase tuning filter 300 includes input terminal 302, output terminal 304, series leg 306, which includes capacitor 308 and inductor 310 (also referred to as an "LC circuit" in the present application), shunt leg 312, which includes capacitor 314, and shunt leg 316, which includes capacitor 318 and inductor 320 (also referred to as an "LC circuit" in the present application).

As shown in FIG. 3, first terminals of capacitor 308 and inductor 310 are coupled to input terminal 302 and a first terminal of capacitor 314 at node 322 and second terminals of capacitor 308 and inductor 310 are coupled to output terminal 304 and a first terminal of capacitor 318 at node 324. Also shown in FIG. 3, a second terminal of capacitor 314 is coupled to ground 326, a second terminal of capacitor 318 is coupled to a first terminal of inductor 320, and a second terminal of inductor 320 is coupled to ground 326.

Harmonic phase tuning filter 300, which comprises a Pi-type filter, can be coupled to an input of an RF switch, such as RF switch 104, and configured to provide a low impedance, such as a phase short, at a harmonic frequency, such as a second or third harmonic frequency, generated by the RF switch. For example, harmonic phase tuning filter 300 can be configured to provide a phase short at a third harmonic of the multi-throw RF switch by appropriately selecting the values of capacitor 318 and inductor 320 in shunt leg 316. Harmonic phase tuning filter 300 can also be configured to provide an output impedance, such as a 50.0 ohm output impedance, to substantially match the input impedance of the RF switch at a fundamental frequency of an RF signal coupled to the input of the RF switch. Thus, harmonic phase tuning filter 300 can provide a low impedance, such as a phase short, at a harmonic frequency, such as a second or third harmonic frequency, generated by the RF switch without significantly affecting the phase of the fundamental frequency. By providing a low impedance at, for example, a third harmonic frequency, an embodiment of the invention's harmonic phase tuning filter can advantageously reduce a third harmonic level generated by a RF switch, such as a multi-throw RF switch, thereby advantageously improving harmonic performance of the RF switch.

Figure 4:
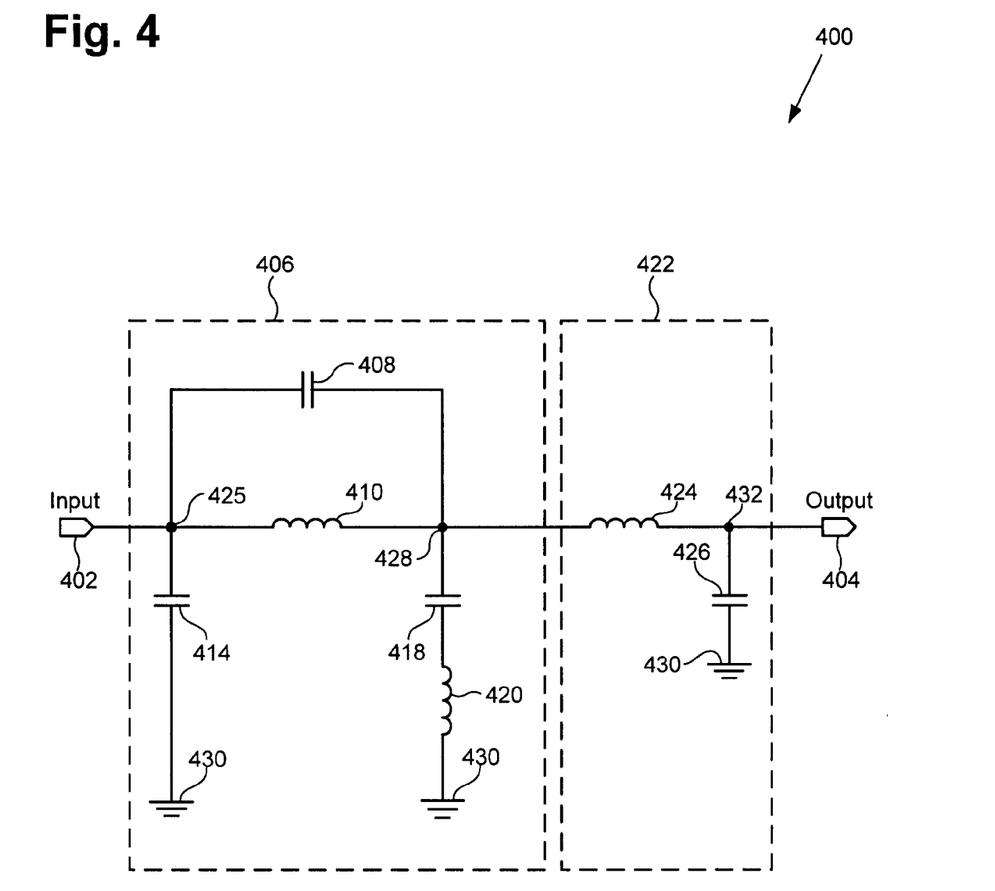
FIG. 4 illustrates a diagram of an exemplary harmonic phase tuning filter in accordance with another embodiment of the present invention.

FIG. 4 shows a schematic diagram of harmonic phase tuning filter 400 in accordance with one embodiment of the present invention. Harmonic phase tuning filter 400 is another exemplary embodiment of the invention's harmonic phase tuning filter, such as harmonic phase tuning filters 106 and 108 in FIG. 1. Harmonic phase tuning filter 400 includes input terminal 402, output terminal 404, input section 406, which comprises capacitors 408, 414, and 418, and inductors 410 and 420, and output section 422, which comprises inductor 424 and capacitor 426. In harmonic phase tuning filter 400, input filter section 406 is coupled in series with output filter section 422 between input terminal 402 and output terminal 404. Input section 406 corresponds to harmonic phase tuning filter 300 in FIG. 3. In particular, capacitors 408, 414, and 418, and inductors 410 and 420 in input section 406 correspond, respectively, to capacitors 308, 314, and 318, and inductors 310 and 320 in harmonic phase tuning filter 300. In other embodiments, input section 406 can comprise a single capacitor or a single inductor.

As shown in FIG. 4, first terminals of capacitor 408 and inductor 410 (also referred to as an "LC circuit" in the present application) are coupled to input terminal 402 and a first terminal of capacitor 414 at node 425 and second terminals of capacitor 408 and inductor 410 are coupled to a first terminal of inductor 424 and a first terminal of capacitor 418 at node 428. Also shown in FIG. 4, a second terminal of capacitor 414 is coupled to ground 430, a second terminal of capacitor 418 is coupled to a first terminal of inductor 420, and a second terminal of inductor 420 is coupled to ground 430. Further shown in FIG. 4, a second terminal of inductor 424 is coupled to a first terminal of capacitor 426 and output terminal 404 at node 432 and a second terminal of capacitor 426 is coupled to ground 430.

Input terminal 402 of harmonic phase tuning filter 400 can be coupled to the output of a power amplifier, such as power amplifier 110 in FIG. 1, and output terminal 404 of harmonic phase tuning filter 400 can be coupled to an input of an RF switch, such as RF switch 104. In harmonic phase tuning filter 400, capacitor 418 and inductor 420 (also referred to as an "LC circuit" in the present application) of input section 406 form a tuned circuit, which provides a low impedance, such as a phase short, at, for example, a third harmonic frequency generated by an RF switch, such as RF switch 104 in FIG. 1. Harmonic phase tuning filter 400 can be configured to provide an output impedance, such as a 50.0 ohm output impedance, that substantially matches an input impedance of the RF switch at a fundamental frequency. Harmonic phase tuning filter 400 can also be configured to provide a selected impedance at a harmonic frequency, such as a second or a third harmonic frequency, generated by the RF switch. The selected impedance can be provided by appropriately tuning an LC circuit comprising inductor 424 and capacitor 426 in output section 422 of harmonic phase tuning filter 400.

The selected impedance can be an optimal impedance for improving the harmonic performance of the RF switch. For example, the selected impedance can improve the harmonic performance of the RF switch by reducing the harmonic level, such as the third harmonic level, in both ON and OFF arms of the RF switch. In the present embodiment, the selected impedance can be determined by rotating the phase of the harmonic frequency, such as a third harmonic frequency, to a desired impedance situated between a phase short and a phase open. The selected impedance depends on the particular harmonic frequency that is generated by the multi-throw switch, which depends on the fundamental frequency of the RF signal that is coupled to an input of the switch via the harmonic phase tuning filter. Harmonic phase tuning filter 400 can be further configured to reduce the level of harmonics, such as second and third harmonic levels, generated by a power amplifier, such as power amplifiers 110 and 112, coupled to input terminal 402 of the harmonic phase tuning filter.

Thus, as discussed above, an embodiment of the invention's harmonic phase tuning filter in FIG. 3 can be integrated with an RF switch to provide a low impedance, such as a phase short, at a harmonic frequency, such as a third harmonic frequency, generated by the RF switch. An embodiment of the invention's harmonic phase tuning filter in FIG. 4 can be integrated with an RF switch, such as a multi-throw RF switch, and tuned to provide a selected impedance at a harmonic frequency, such as a third harmonic frequency, generated by the RF switch. The selected impedance can be selected between a phase short and a phase open to achieve an optimal impedance at a harmonic frequency, such as a third harmonic frequency, generated by the RF switch, thereby advantageously improving harmonic performance of the RF switch.

Also, while providing a low impedance or a selected impedance at a harmonic frequency generated by an RF switch, such as a multi-throw RF switch, embodiments of invention's harmonic phase tuning filter also provide an output impedance, such as a 50.0 ohm output impedance, that substantially matches the input impedance of the RF switch at a fundamental frequency.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a harmonic phase tuning filter for RF switches has been described.

The invention claimed is:

1. A switching module comprising:
   a first harmonic phase tuning filter coupled to a first input of an RF switch;
   said first harmonic phase tuning filter including an input section comprising a Pi-type LC filter and an output section, said output section coupled between said input section and said first input of said RF switch;
   said first harmonic phase tuning filter configured to provide an output impedance that substantially matches an input impedance of said RF switch at approximately a fundamental frequency and to provide a selected impedance at approximately a third harmonic frequency generated by said RF switch;
   wherein said Pi-type LC filter comprises:
      a first capacitor and a first inductor coupled in parallel between input and output terminals of said input section;
      a second capacitor coupled between said input terminal of said input section and ground; and
      a tuned circuit comprising a third capacitor coupled in series with a second inductor between said output terminal of said input section and said ground, said tuned circuit being tuned to provide substantially a phase short at approximately said third harmonic frequency generated by said RF switch; and
   wherein said output section comprises an LC circuit coupled between said output terminal of said input section and said first input of said RF switch, said LC circuit being tuned to provide said selected impedance so as to improve harmonic performance of said first RF switch, a value of said selected impedance not including a phase short or a phase open.

2. The switching module of claim 1 further comprising a second harmonic phase tuning filter coupled to a second input of said RF switch.

3. The switching module of claim 2, wherein said RF switch and said first and second harmonic phase tuning filters are fabricated on a single semiconductor die.

4. The switching module of claim 1, wherein said first harmonic phase tuning filter is coupled between an output of a first power amplifier and said first input of said RF switch.

5. The switching module of claim 1, wherein said LC circuit of said output section of said first harmonic phase tuning filter is configured to rotate a phase of said third harmonic frequency to said selected impedance.

6. The switching module of claim 1, wherein said output impedance provided by said first harmonic phase tuning filter at said fundamental frequency is approximately 50 Ohms.

7. The switching module of claim 1, wherein values of said third capacitor and said second inductor are selected to tune said tuned circuit to provide substantially said phase short at approximately said third harmonic frequency generated by said RF switch.

8. The switching module of claim 1, wherein said selected impedance is an optimal impedance for improving said harmonic performance of said RF switch.

9. The switching module of claim 1, wherein said LC circuit of said output section includes a third inductor coupled in series between said output terminal of said input section and said first input of said RF switch, and a fourth capacitor coupled between said first input of said RF switch and said ground.

* * * * *